United States Patent
Yan et al.

(10) Patent No.: US 10,650,214 B2
(45) Date of Patent: May 12, 2020

(54) FINGERPRINT SENSOR AND METHOD OF FINGERPRINT DETECTION

(71) Applicant: IMAGE MATCH DESIGN INC., Hsinchu County (TW)

(72) Inventors: Yehsuan Yan, Taichung (TW); Yen-Kuo Lo, Tainan (TW)

(73) Assignee: IMAGE MATCH DESIGN INC., Hsinchu County (TW)

( * ) Notice: Subject to any disclaimer, the term of this patent is extended or adjusted under 35 U.S.C. 154(b) by 53 days.

(21) Appl. No.: 15/961,136

(22) Filed: Apr. 24, 2018

(65) Prior Publication Data

US 2019/0325184 A1   Oct. 24, 2019

(51) Int. Cl.
| | | |
|---|---|---|
| *G06F 3/044* | (2006.01) | |
| *G01D 5/24* | (2006.01) | |
| *H03K 17/96* | (2006.01) | |
| *G06K 9/00* | (2006.01) | |
| *H02J 7/00* | (2006.01) | |
| *H02J 7/34* | (2006.01) | |

(52) U.S. Cl.
CPC .......... *G06K 9/0002* (2013.01); *H02J 7/0021* (2013.01); *H03K 17/962* (2013.01); *G01D 5/24* (2013.01); *G06F 3/044* (2013.01); *H02J 7/345* (2013.01)

(58) Field of Classification Search
CPC ........ G06F 3/044; G01D 5/24; H03K 17/962; G06K 9/0002; H02J 7/0021; H02J 7/345
See application file for complete search history.

(56) References Cited

U.S. PATENT DOCUMENTS

| | | |
|---|---|---|
| 8,283,934 B2 | 10/2012 | Nishizono |
| 9,013,447 B2 | 4/2015 | Kim |
| 2001/0022337 A1 | 9/2001 | Basse et al. |

(Continued)

FOREIGN PATENT DOCUMENTS

| | | |
|---|---|---|
| CN | 201594117 U | 9/2010 |
| CN | 106462761 A | 2/2017 |

OTHER PUBLICATIONS

Office Action dated Oct. 16, 2019 for the Taiwanese counterpart application 107128662.

(Continued)

*Primary Examiner* — Kenny A Cese

(74) *Attorney, Agent, or Firm* — WPAT, P.C., Intellectual Property Attorneys; Anthony King

(57) ABSTRACT

A fingerprint sensor is disclosed. The fingerprint sensor includes a sensor plate, a voltage source, a control circuit and a first conductive plate. The sensor plate detects a first capacitance in response to a touch event on the fingerprint sensor. The voltage source establishes a predetermined voltage difference between a first node and a second node. The control circuit, connected to the sensor plate via the first node, charges a first capacitor associated with the first capacitance during a charge period, and discharges the first capacitor during a discharge period. The first conductive plate, separated from the sensor plate, is coupled with the voltage source via the second node. During the charge period and the discharge period of the control circuit, a voltage difference between the sensor plate and the first conductive plate is maintained at the predetermined voltage difference.

14 Claims, 6 Drawing Sheets

(56) References Cited

U.S. PATENT DOCUMENTS

2003/0190061 A1 10/2003 Chou et al.
2015/0346253 A1* 12/2015 Wang ................. G06K 9/00073
                                                      324/662
2016/0364045 A1* 12/2016 Lo ........................... G06F 3/016

OTHER PUBLICATIONS

English abstract translation of the Office Action dated Oct. 16, 2019 for the Taiwanese counterpart application 107128662.
English abstract translation of CN106462761A.
English abstract translation of CN201594117U.

* cited by examiner

FINGERPRINT SENSOR AND METHOD OF FINGERPRINT DETECTION

TECHNICAL FIELD

The present disclosure is generally related to fingerprint acquisition and, more particularly, to a fingerprint sensor and a method of fingerprint detection using the fingerprint sensor.

BACKGROUND

Nowadays the convenience of mobile appliances like IC cards, smart phones and notebook computers brings us better life but also into privacy threat. The more widespread these mobile appliances are, the more significant the issue on personal security is. As a result, the demand for user authentication is becoming more and more important. Some biometrics, such as fingerprint, hand geometry, iris and voice print, have been popularly applied in authentication. Because of the property of low-cost, easy integration and high reliability, many researches have been reported on fingerprint acquisition. Fingerprint acquisition can be performed by capacitive sensing scheme. However, parasitic capacitance nearby a fingerprint sensor usually reduces the sensitivity and the output dynamic range. It may therefore be desirable to have a fingerprint sensor that is able to alleviate the effect of parasitic capacitance.

SUMMARY

Embodiments of the present invention provide a fingerprint sensor. The fingerprint sensor includes a sensor plate, a voltage source, a control circuit and a first conductive plate. The sensor plate detects a first capacitance in response to a touch event on the fingerprint sensor. The voltage source establishes a predetermined voltage difference between a first node and a second node. The control circuit, connected to the sensor plate via the first node, charges a first capacitor associated with the first capacitance during a charge period, and discharges the first capacitor during a discharge period. The first conductive plate, separated from the sensor plate, is coupled with the voltage source via the second node. During the charge period and the discharge period of the control circuit, a voltage difference between the sensor plate and the first conductive plate is to maintained at the predetermined voltage difference.

In an embodiment, the fingerprint sensor further includes a second conductive plate electrically connected between the first conductive plate and the voltage source, and connected to the voltage source via the second node.

In another embodiment, a voltage difference between the sensor plate and the second conductive plate is maintained at the predetermined voltage difference during the charge period and the discharge period of the control circuit.

In yet another embodiment, the control circuit is configured to charge the first capacitor to a first voltage level during the charge period in response to a first state of a control signal.

In still another embodiment, the control circuit is configured to discharge the second capacitor to a reference voltage level during the charge period in response to the first state of the control signal.

In yet still another embodiment, the control circuit is configured to cause a second voltage level across the second capacitor during the discharge period in response to a second state of the control signal, the second voltage level (VR) expressed as:

$$VR = VDD \times \frac{CF}{(CF + CS)}$$

wherein VDD, CF and CS represent the first voltage level, the first capacitance and the second capacitance, respectively.

In still yet another embodiment, the voltage source includes a transistor and a current sink. A gate of the transistor is connected via the first node to the control circuit, and a terminal of the transistor is connected via the second node to the current sink.

In a further embodiment, the current sink is configured to provide a current of a predetermined magnitude, and the predetermined voltage difference is determined by the predetermined magnitude of the current.

In another further embodiment, the voltage source includes a transistor and a current source. A gate of the transistor is connected via the first node to the control circuit, and a terminal of the transistor connected via the second node to the current source.

In yet another further embodiment, the current source is configured to provide a current of a predetermined magnitude, and the predetermined voltage difference is determined by the predetermined magnitude of the current.

Embodiments of the present invention provide a method of detecting a fingerprint. The method includes providing a sensor plate for detecting a first capacitance in response to a touch event; providing a first conductive plate separated from the sensor plate; electrically connecting the sensor plate via a first node to a voltage source; electrically connecting the first conductive plate via a second node to the voltage source, the voltage source configured to establish a predetermined voltage difference between the first node and the second node; and determining the fingerprint by charging one of a first capacitor associated with the first capacitance and a second capacitor during a charge period and discharge the one of the first capacitor and the second capacitor during a discharge period. A voltage difference between the sensor plate and the first conductive plate is maintained at the predetermined voltage difference during the charge period and the discharge period.

The foregoing has outlined rather broadly the features and technical advantages of the present invention in order that the detailed description of the invention that follows may be better understood. Additional features and advantages of the invention will be described hereinafter. It should be appreciated by persons having ordinary skill in the art that the conception and specific embodiments disclosed may be readily utilized as a basis for modifying or designing other structures or processes for carrying out the same purposes of the present invention without departing from the spirit and scope of the invention as set forth in the appended claims.

BRIEF DESCRIPTION OF THE DRAWINGS

Details of one or more embodiments of the disclosure are set forth in the accompanying drawings and the description below. Other features and advantages of the disclosure will be apparent from the description, drawings and claims. Throughout the various views and illustrative embodiments, like reference numerals are used to designate like elements.

Reference will now be made in detail to exemplary embodiments illustrated in the accompanying drawings.

DETAIL DESCRIPTION

In order to make the disclosure comprehensible, detailed steps and structures are provided in the following description. Obviously, implementation of the disclosure does not limit special details known by persons skilled in the art. In addition, known structures and steps are not described in detail, so as not to limit the disclosure unnecessarily. Preferred embodiments of the disclosure will be described below in detail. However, in addition to the detailed description, the disclosure may also be widely implemented in other embodiments. The scope of the disclosure is not limited to the detailed description, and is defined by the claims.

Further, it will be understood that when an element is referred to as being "connected to" or "coupled to" or "coupled with" another element, it may be directly connected to or coupled to the other element, or intervening elements may be present.

In the below description, a signal is asserted with a high logical value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

Figure 1:
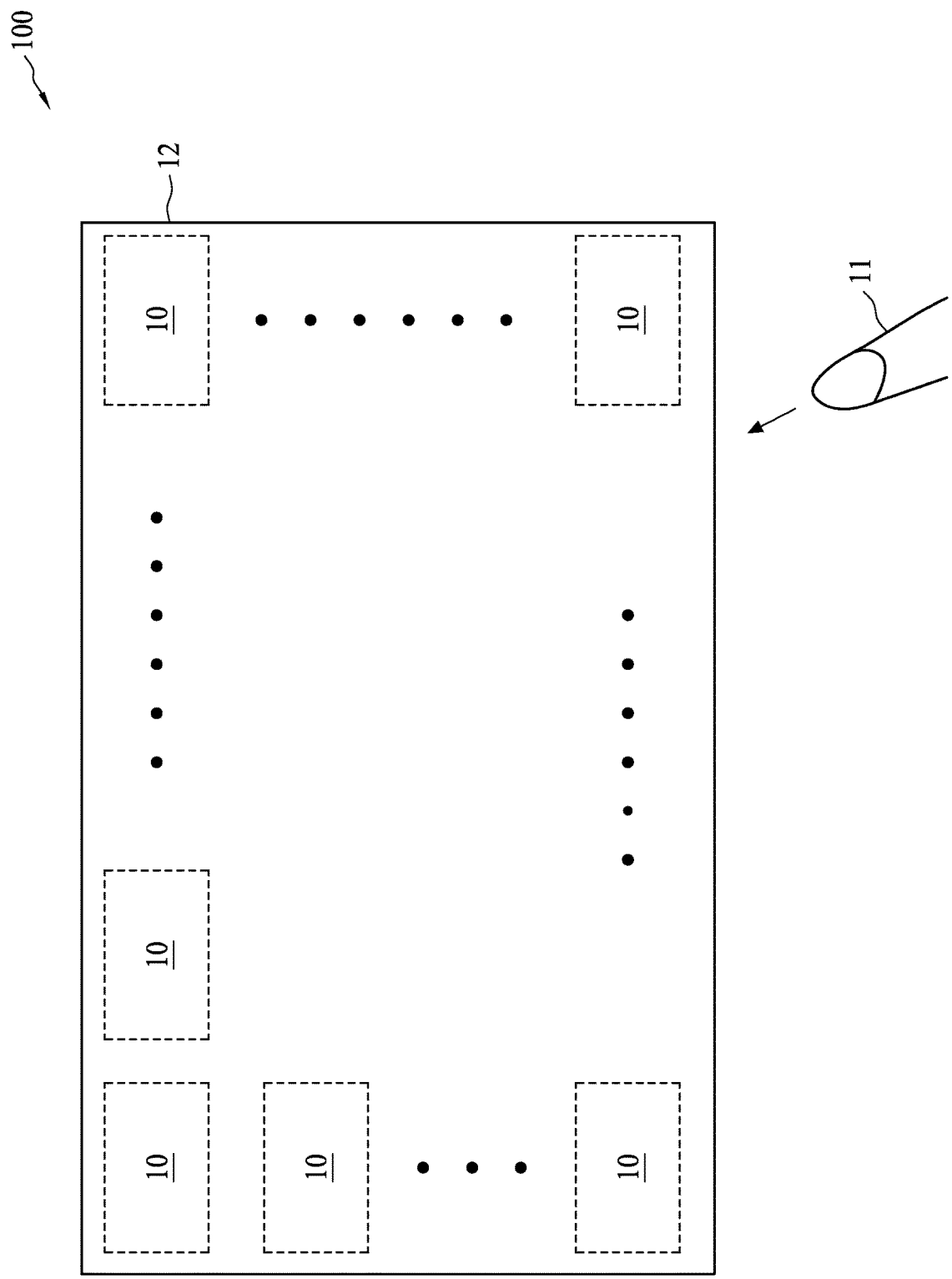
FIG. 1 is a top view of a fingerprint sensor, in accordance with some embodiments of the present invention.

FIG. 1 is a top view of a fingerprint sensor 100, in accordance with some embodiments of the present invention. The fingerprint sensor 100 is adapted to work with an electronic device (not shown), such as a smart phone, a personal computer and a personal digital assistant.

Referring to FIG. 1, the fingerprint sensor 100 includes an array of sensing elements 10, which are covered by a protection layer 12. Each of the sensing elements 10 corresponds to a pixel of the fingerprint sensor 100. The sensing elements 10 are configured to detect a touch event of an object 11, such as a stylus, pen or one or more fingers of a user, when tapping or moving across the surface of the protection layer 12.

Figure 2A:
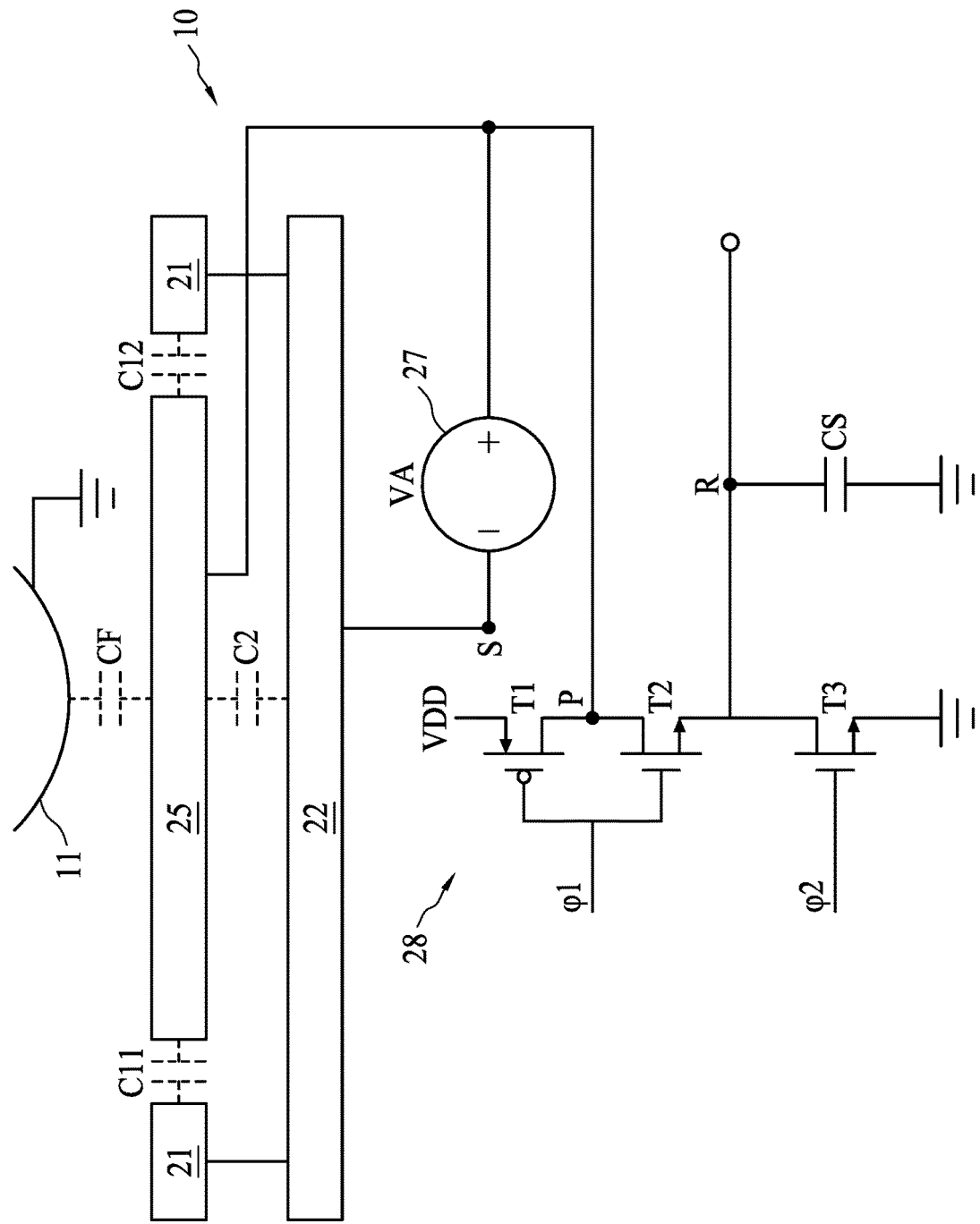
FIG. 2A is a schematic diagram of a sensing element of the fingerprint sensor shown in FIG. 1, in accordance with an embodiment of the present invention.

FIG. 2A is a schematic diagram of a sensing element 10 of the fingerprint sensor 100 shown in FIG. 1, in accordance with an embodiment of the present invention. Referring to FIG. 2A, the sensing element 10 includes a sensor plate 25, at least one first conductive plate 21, a second conductive plate 22, a voltage source 27 and a control circuit 28.

The sensor plate 25 is configured to detect a capacitance CF associated with the object 11 in response to a touch event on the fingerprint sensor 100. The sensor plate 25 may include a conductive plate disposed over a semiconductor substrate (not shown). In fingerprint acquisition, the object 11 can be deemed as a grounded conductor. As a result, a capacitor associated with the capacitance CF exists between the sensor plate 25 and the object 11 when a touch event appears. Throughout the present disclosure, for convenience, a reference numeral or label used for a capacitor is also used for its capacitance and vice versa. For example, while the reference label "CF" as above mentioned refers to a capacitance as illustrated in FIG. 2A, the reference label CF also represents a capacitor having the capacitance. Moreover, the capacitor CF in FIG. 2A is shown in dashed lines, which indicates an equivalent circuit for a capacitor without conductor plates.

The first conductive plate 21 functions to shield the sensor plate from parasitic capacitance between the sensor plate 25 of the current sensing element 10 and an immediately adjacent sensor plate of another sensing element (not shown). The first conductive plate 21 is disposed adjacent to the sensor plate 25 in a same patterned conductive layer over the substrate. For example, the first conductive plate 21 and the sensor plate 25 are disposed in a metal-4 (M4) layer. In the present embodiment, at least one first parasitic capacitance C11 and C12 exists between the sensor plate 25 and the at least one first conductive plate 21. Such parasitic capacitance may reduce the sensitivity of the fingerprint sensor 100 and thus is undesirable.

The second conductive plate 22 also functions to shield the sensor plate 25. The second conductive plate 22, electrically connected to the first conductive plate 21, is disposed adjacent to the sensor plate 25 in a different conductive layer from the first conductive plate 21. For example, the second conductive plate 22 is disposed in a metal-3 (M3) layer under the sensor plate 25. In the present embodiment, a second parasitic capacitance C2 exists between the sensor plate 25 and the second conductive plate 22. Like the first parasitic capacitance C11, C12, the second parasitic capacitance C2 is undesirable.

The voltage source 27 is configured to establish a predetermined voltage difference VA between a first node P and a second node S. The voltage source 27 is electrically connected via the first node P to the control circuit 28, and electrically connected via the second node S to the second conductive plate 22 and hence electrically coupled with the first conductive plate 21. In the present embodiment, the first node P and the second node S are connected to a positive voltage terminal (labeled "+") and a negative voltage terminal (labeled "−") of the voltage source 27, respectively. In other embodiments, the first node P and the second node S may be connected to the negative voltage terminal and the positive voltage terminal of the voltage source 27, respectively.

The control circuit 28, electrically connected via the first node P to the sensor plate 25, is configured to charge the capacitor CF during a charge period and discharge the capacitor CF during a discharge period. In the present embodiment, the control circuit 28 includes a first transistor T1, a second transistor T2 and a third transistor T3. Moreover, the first transistor T1 includes a p-type transistor such as a p-type metal-oxide-semiconductor (PMOS) transistor. In addition, each of the second transistor T2 and third transistor T3 includes an n-type transistor such as an n-type metal-oxide-semiconductor (NMOS) transistor.

A gate of the first transistor T1 receives a first control signal 1I. A source of the first transistor T1 receives a supply voltage VDD. A drain of the first transistor T1 is connected to the voltage source 27 and the sensor plate 25 via the first node P. Persons having ordinary skill in the art will understand that drain and source terminals of a MOS transistor may be interchangeable, depending on voltage levels applied thereto.

A gate of the second transistor T2 also receives the first control signal φ1. A source of the second transistor T2 is connected at a node R to a plate of a capacitor CS. The capacitor CS serves as a storage capacitor. A drain of the second transistor T2 is connected to the drain of the first transistor T1 and hence connected via the first node P to the voltage source 27 and the sensor plate 25.

A gate of the third transistor T3 receives a second control signal φ2. A source of the third transistor T3 is connected to a reference voltage level, for example, ground. A drain of the third transistor T3 is connected to the source of the second transistor T2 and hence connected via the node R to the capacitor CS. In the present embodiment, the second control signal φ2 and the first control signal φ1 operate on opposite timing patterns. Accordingly, when the first control signal φ1 is logical one (1), the second control signal φ2 is logical zero (0), and vice versa.

In operation, the first transistor T1 is turned on in response to a first state of the first control signal φ1. Specifically, the first state is logically low such that φ1 equals logical zero (0). Meanwhile, the second transistor T2 is turned off in response to the logically-low first control signal φ1. Since the first control signal φ1 and the second control signal φ2 are complementary to each other, the third transistor T3 is turned on in response to a logically-high second control signal φ2.

As the second transistor T2 is turned off, the capacitor CS is disconnected from the first node P. In addition, as the third transistor T3 is turned on, the capacitor CS is discharged to ground. Further, as the first transistor T1 is turned on, the voltage level at the first node P is pulled high to VDD. Since the sensor plate 25 is connected to the first node P, the voltage level at the sensor plate 25 is also VDD. As a result, a voltage difference between the sensor plate 25 and the object 11 is VDD, denoted as VCF=VDD. Accordingly, in response to the first state of the first control signal φ1, the capacitor CF associated with the object 11 is charged to VDD, and the capacitor CS is discharged to the reference voltage level. Meanwhile, the voltage level at the second node S, due to the predetermined voltage difference VA between the first node P and the second node S, is VDD-VA. Since the first conductive plate 21 and the second conductive plate 22 are connected to the first node S, the voltage level at each of the first conductive plate 21 and second conductive plate 22 is also VDD-VA. As a result, a voltage difference between the sensor plate and the first conductive plate 21 is VA (=VDD−(VDD-VA)), denoted as VC11=VA and VC12=VA. Also, a voltage difference between the sensor plate 25 and the second conductive plate 22 is VA (=VDD−(VDD-VA)), denoted as VC2=VA.

Accordingly, the first state of the first control signal φ1 triggers a charging process. The control circuit 28 charges the capacitor CF during the charge period and, with the help of the voltage source 27, creates a voltage equal to the predetermined voltage difference VA across the capacitors C11, C12 and C2.

After the charge period, the first transistor T1 is turned off in response to a second state of the first control signal 1. Specifically, the second state is logically high such that 41 equals logical one (1). Meanwhile, the second transistor T2 is turned on in response to the logically-high first control signal 61. In addition, the third transistor T3 is turned off in response to a logically-low second control signal 2. As a result, the capacitor CS is connected via the second transistor T2 and the first node P to the sensor plate 25, forming a discharging path from the capacitor CF. Further, with the help of the voltage source 27 that establishes the predetermined voltage difference VA between the first node P and the second node S, no matter what voltage level at the first node P may reach during the discharging process, VC11, VC12 and VC2 are maintained at VA. Since VC11, VC12 and VC2 are kept unchanged during both of the charge and discharge periods, charge stored in the capacitor CF in the charge period is shared between the capacitors CF and CS during the discharge period. By function of charge sharing, the voltage level at the node R, denoted as VR, which is equal potential with the first node P, can be expressed in an equation below.

$$VR = VDD \times \frac{CF}{(CF + CS)}$$

VR is positively correlated to the sensitivity of the fingerprint sensor 100. In view of the above equation, VR is independent of the undesired parasitic capacitances C11, C12 and C2. Effectively, the adverse effects of the parasitic capacitances C11, C12 and C2 are alleviated or even eliminated.

Figure 2B:
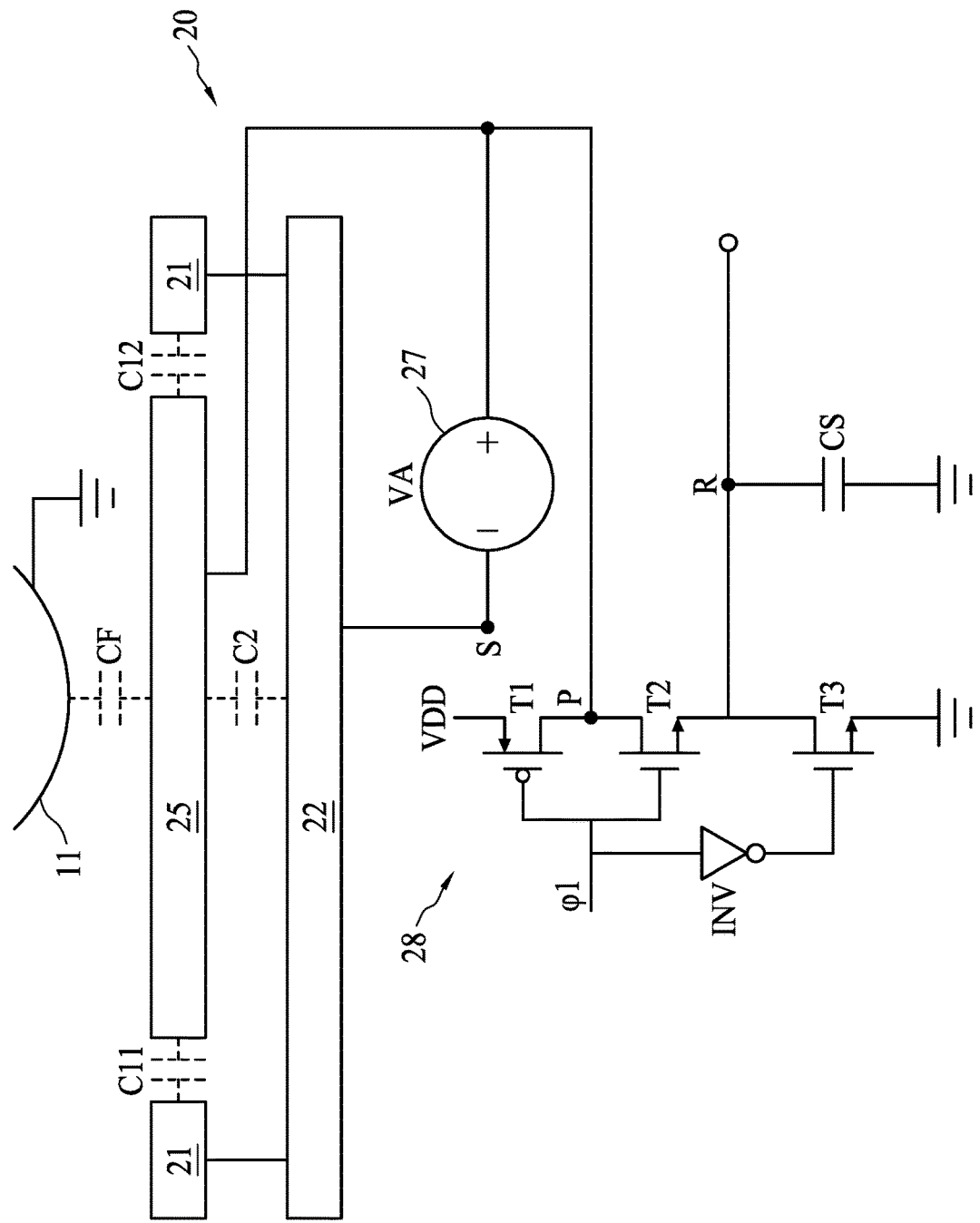
FIG. 2B is a schematic diagram of a sensing element of the fingerprint sensor shown in FIG. 1, in accordance with another embodiment of the present invention.

FIG. 2B is a schematic diagram of a sensing element 20 of the fingerprint sensor 100 shown in FIG. 1, in accordance with another embodiment of the present invention.

Referring to FIG. 2B, the sensing element 20 is similar to the sensing element 10 described and illustrated with reference to FIG. 2A except that, for example, an inverter INV is added. An input of the inverter INV receives the first control signal φ1. An output of the inverter INV is connected to the gate of the third transistor T3. As a result, when the gates of the first and second transistors T1, T2 receive a first state of the first control signal 1, the gate of the third transistor T3 receives a second state of the first control signal φ1, and vice versa. As such, the second control signal φ2 is eliminated.

Figure 3:
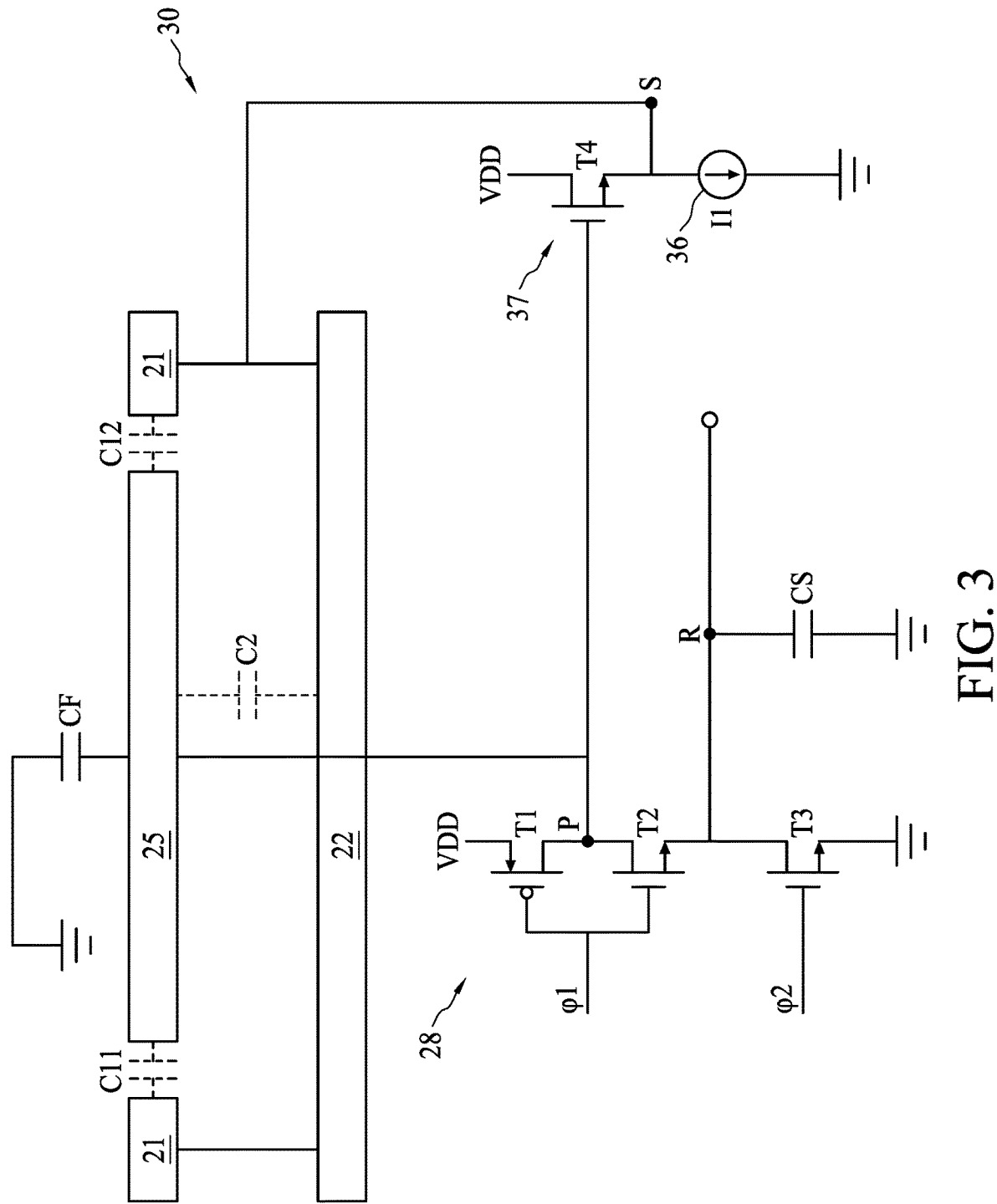
FIG. 3 is a schematic diagram of a sensing element of the fingerprint sensor shown in FIG. 1, in accordance with yet another embodiment of the present invention.

FIG. 3 is a schematic diagram of a sensing element 30 of the fingerprint sensor 100 shown in FIG. 1, in accordance with yet another embodiment of the present invention.

Referring to FIG. 3, the sensing element 30 is similar to the sensing element 10 described and illustrated with reference to FIG. 2A except that, for example, a voltage source 37 replaces the voltage source 27. The voltage source 37 includes a fourth transistor T4 and a current sink 36. The fourth transistor T4 includes an n-type transistor such as an NMOS transistor. A gate of the fourth transistor T4 is connected to the first node P and hence to the sensor plate 25 and the drains of the first and second transistors T1, T2. A drain of the fourth transistor T4 receives VDD. A source of the fourth transistor T4 is connected to the second node S and hence to the first and second conductive plates 21, 22. The current sink 36 is connected between the second node S and ground.

In operation, the current sink 36 generates a constant current I1. The magnitude of the current I1 is positively correlated to $(Vgs4-Vt4)^2$, wherein Vgs4 represents a gate-to-source voltage of the fourth transistor T4, and Vt4 represents a threshold voltage of the fourth transistor T4. Since Vgs4 is also the voltage across the first node P and second node S, as a result, the voltage difference between the first node P and the second node S is determined by a predetermined magnitude of the current I1 generated by the current sink 36. The voltage source 37 accordingly provides a predetermined voltage difference Vgs4 between the first node P and the second node S.

Figure 4:
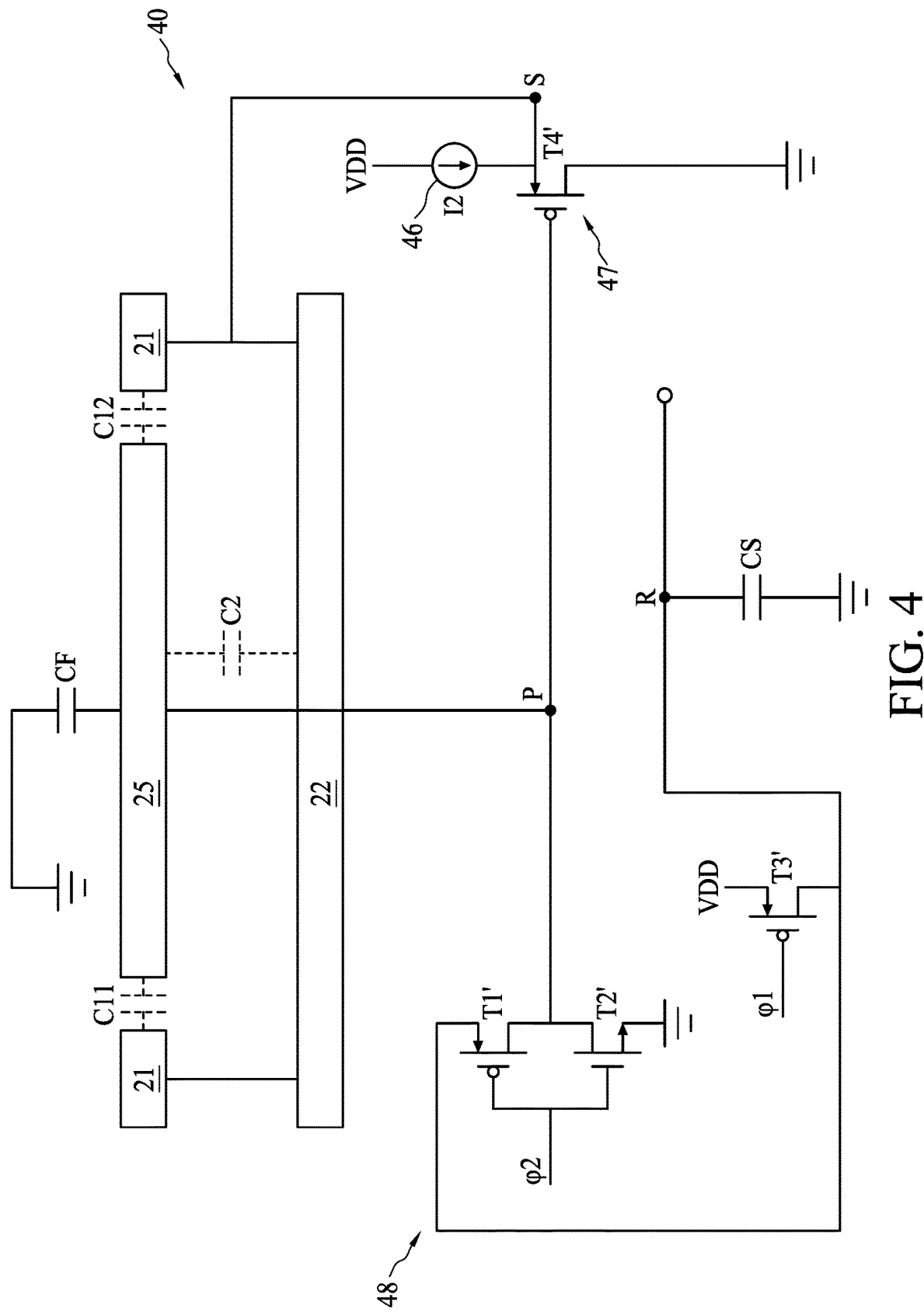
FIG. 4 is a schematic diagram of a sensing element of the fingerprint sensor shown in FIG. 1, in accordance with still another embodiment of the present invention.

FIG. 4 is a schematic diagram of a sensing element 40 of the fingerprint sensor 100 shown in FIG. 1, in accordance with still another embodiment of the present invention.

Referring to FIG. 4, the sensing element 40 is similar to the sensing element 10 described and illustrated with reference to FIG. 2A except that, for example, a control circuit 48 and a voltage source 47 replace the control circuit 28 and the voltage source 27, respectively. The control circuit 48 is configured to charge the capacitor CS during a charge period and discharge the capacitor CS during a discharge period. In the present embodiment, the control circuit 48 includes a first transistor T1', a second transistor T2' and a third transistor T3'. Moreover, each of the first and third transistors T1', T3' includes a p-type transistor such as a PMOS transistor, and the second transistor T2' includes an n-type transistor such as an NMOS transistor.

A gate of the first transistor T1' receives a second control signal 2. A source of the first transistor T1' is connected at a node R to a plate of the capacitor CS. A drain of the first transistor T1' is connected to the sensor plate 25 via the first node P.

A gate of the second transistor T2' also receives the second control signal φ2. A source of the second transistor T2' is connected to ground. A drain of the second transistor T2' is connected to the drain of the first transistor T1' and hence connected via the first node P to the sensor plate 25.

A gate of the third transistor T3' receives a first control signal 1. A source of the third transistor T3' receives VDD. A drain of the third transistor T3' is connected to the source of the first transistor T1' and hence connected via the node R to the capacitor CS. Similarly, the first control signal φ1 and the second control signal φ2 operate on opposite timing patterns. Accordingly, when the first control signal φ1 is logical one (1), the second control signal φ2 is logical zero (0), and vice versa.

The voltage source 47 includes a fourth transistor T4' and a current source 46. The fourth transistor T4' includes a p-type transistor such as a PMOS transistor. A gate of the fourth transistor T4' is connected to the first node P and hence to the sensor plate 25 and the drains of the first and second transistors T1', T2'. A drain of the fourth transistor T4' is connected to ground. A source of the fourth transistor T4' is connected to the second node S and hence to the first and second conductive plates 21, 22. The current source 46 is connected between the second node S and the supply voltage VDD.

The current source 46 generates a constant current I2. The magnitude of the current I2 is positively correlated to $(|Vgs4|-|Vt4|)^2$, wherein Vgs4 represents a gate-to-source voltage of the fourth transistor T4', and Vt4 represents a threshold voltage of the fourth transistor T4'. Since Vgs4 is also the voltage across the first node P and second node S, as a result, the voltage difference between the first node P and the second node S is determined by a predetermined magnitude of the current I2 generated by the current source 46.

In operation, the third transistor T3' is turned on in response to a first state, logically low, of the first control signal 1. Meanwhile, the first transistor T1' is turned off and the second transistor T2' is turned on in response to a logically-high state of the second control signal φ2. As the first transistor T1' is turned off, the capacitor CS is disconnected from the first node P. Further, as the third transistor T3' is turned on, the capacitor CS is charged to VDD. Moreover, as the second transistor T2' is turned on, the voltage level at the first node P is pulled low to ground. Since the sensor plate 25 is connected to the first node P, the voltage level at the sensor plate 25 is also ground level. Meanwhile, the voltage level at the second node S, due to the predetermined voltage difference VA between the first node P and the second node S, is |Vgs4| (=|Vgs4|-0). As a result, a voltage difference between the sensor plate 25 and each of the first and second conductive plates 21 and 22 is |Vgs4|.

After the charge period, the third transistor T3' is turned off in response to a second state, logically high, of the first control signal φ1. Meanwhile, the first transistor T1' is turned on and the second transistor T2' is turned off in response to a logically-low state of the second control signal φ2. As a result, the capacitor CS is connected via the first transistor T1' and the first node P to the sensor plate 25, forming a discharging path from the capacitor CS. Further, with the help of the voltage source 47 that establishes the predetermined voltage difference VA (=|Vgs4|) between the first node P and the second node S, no matter what voltage level at the first node P may reach during the discharging process, VC11, VC12 and VC2 are maintained at VA. Since VC11, VC12 and VC2 are kept unchanged during both of the charge and discharge periods, charge stored in the capacitor CS in the charge period is shared between the capacitors CF and CS during the discharge period. By function of charge sharing, the voltage level at the node R, denoted as VR, which is equal potential with the first node P, can be expressed in an equation below.

$$VR = VDD \times \frac{CF}{(CF + CS)}$$

Figure 5:
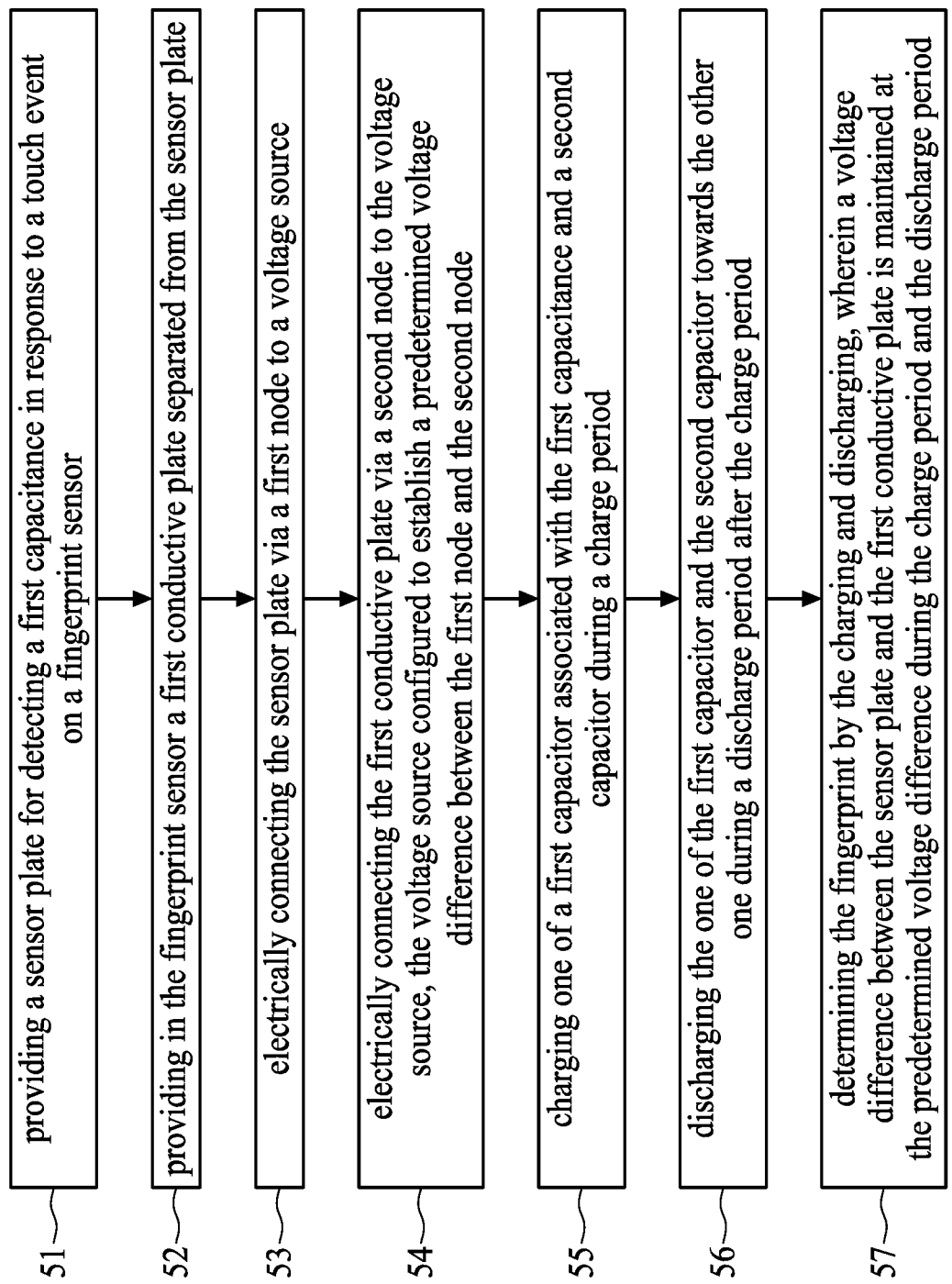
FIG. 5 is a flow diagram showing a method of fingerprint detection, in accordance with some embodiments of the present invention.

FIG. 5 is a flow diagram showing a method of fingerprint detection, in accordance with some embodiments of the present invention.

Referring to FIG. 5, in operation 51, a sensor plate is provided for detecting a first capacitance in response to a touch event on a fingerprint sensor.

In operation 52, a first conductive plate separated from the sensor plate is provided. The first conductive plate may function as a shielding plate.

In operation 53, the sensor plate is electrically connected via a first node to a voltage source.

In operation 54, the first conductive plate is electrically connected via a second node to the voltage source. The voltage source is configured to establish a predetermined voltage difference between the first node and the second node.

In operation 55, one of a first capacitor associated with the first capacitance and a second capacitor is charged during a charge period. The second capacitor functions to serve as a storage capacitor.

In operation 56, the one of the first capacitor and the second capacitor that is charged in the charge period is discharged towards the other one of the first capacitor and the second capacitor during a discharge period after the charge period.

In operation 57, the fingerprint is determined by the charging and discharge. A voltage difference between the sensor plate and the first conductive plate is maintained at the predetermined voltage difference during the charge period and the discharge period.

With the voltage across the first conductive plate and the sensor plate being kept unchanged in both of the charge and discharge periods, adverse effects of an undesired parasitic capacitance associated with the first conductive plate can be alleviated or even eliminated. Effectively, the sensitivity of the fingerprint sensor is independent of the undesired parasitic capacitance.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A fingerprint sensor, comprising:
 a sensor plate configured to detect a first capacitance in response to a touch event on the fingerprint sensor;
 a voltage source configured to establish a predetermined voltage difference between a first node and a second node;
 a second capacitor having a second capacitance;
 a control circuit connected to the sensor plate via the first node, the control circuit configured to charge one of a first capacitor associated with the first capacitance and the second capacitor during a charge period and discharge the one of the first capacitor and the second capacitor during a discharge period; and
 a first conductive plate separated from the sensor plate, the first conductive plate coupled with the voltage source via the second node,
 wherein a voltage difference between the sensor plate and the first conductive plate is maintained at the predetermined voltage difference during the charge period and the discharge period of the control circuit,
 wherein the voltage source includes a transistor and a current sink, a gate of the transistor connected via the first node to the control circuit, and a terminal of the transistor connected via the second node to the current sink, and
 wherein the current sink is configured to provide a current of a predetermined magnitude, and the predetermined voltage difference is determined by the predetermined magnitude of the current.

2. The fingerprint sensor of claim 1 further comprising a second conductive plate electrically connected between the first conductive plate and the voltage source, and connected to the voltage source via the second node.

3. The fingerprint sensor of claim 2, wherein a voltage difference between the sensor plate and the second conductive plate is maintained at the predetermined voltage difference during the charge period and the discharge period of the control circuit.

4. The fingerprint sensor of claim 1, wherein the control circuit is configured to charge the first capacitor to a first voltage level during the charge period in response to a first state of a control signal.

5. The fingerprint sensor of claim 4, wherein the control circuit is configured to discharge the second capacitor to a reference voltage level during the charge period in response to the first state of the control signal.

6. The fingerprint sensor of claim 5, wherein the control circuit is configured to cause a second voltage level across the second capacitor during the discharge period in response to a second state of the control signal, the second voltage level (VR) expressed as:

$$VR = VDD \times \frac{CF}{(CF + CS)}$$

wherein VDD, CF and CS represent the first voltage level, the first capacitance and the second capacitance, respectively.

7. A method of detecting a fingerprint, the method comprising:
 providing a sensor plate for detecting a first capacitance in response to a touch event;
 providing a first conductive plate separated from the sensor plate;
 electrically connecting the sensor plate via a first node to a voltage source;
 electrically connecting the first conductive plate via a second node to the voltage source, the voltage source configured to establish a predetermined voltage difference between the first node and the second node; and
 determining the fingerprint by charging one of a first capacitor associated with the first capacitance and a second capacitor during a charge period and discharge the one of the first capacitor and the second capacitor during a discharge period,
 wherein a voltage difference between the sensor plate and the first conductive plate is maintained at the predetermined voltage difference during the charge period and the discharge period,
 wherein the voltage source includes a transistor and a current sink, further comprising:
 connecting a gate of the transistor via the first node to the sensor plate, and connecting a terminal of the transistor via the second node to the current sink,
 wherein the current sink is configured to provide a current of a predetermined magnitude, further comprising:
 providing the predetermined voltage difference based on the predetermined magnitude of the current.

8. The method of claim 7 further comprising:
 providing a second conductive plate between the first conductive plate and the voltage source; and
 electrically connecting the second conductive plate to the voltage source via the second node.

9. The method of claim 8, wherein a voltage difference between the sensor plate and the second conductive plate is maintained at the predetermined voltage difference during the charge period and the discharge period of the control circuit.

10. The method of claim 7, wherein charging the first capacitor further comprises:
 charging the first capacitor to a first voltage level during the charge period in response to a first state of a control signal.

11. The method of claim 10, wherein the second capacitor having a second capacitance, further comprising:
 discharging the second capacitor to a reference voltage level during the charge period in response to the first state of the control signal.

12. The method of claim 11, wherein discharging the one of the first capacitor and the second capacitor further comprises:
 causing a second voltage level across the second capacitor during the discharge period in response to a second state of the control signal, the second voltage level (VR) expressed as:

$$VR = VDD \times \frac{CF}{(CF + CS)}$$

wherein VDD, CF and CS represent the first voltage level, the first capacitance and the second capacitance, respectively.

13. A fingerprint sensor, comprising:
a sensor plate configured to detect a first capacitance in response to a touch event on the fingerprint sensor;
a voltage source configured to establish a predetermined voltage difference between a first node and a second node;
a second capacitor having a second capacitance;
a control circuit connected to the sensor plate via the first node, the control circuit configured to charge one of a first capacitor associated with the first capacitance and the second capacitor during a charge period and discharge the one of the first capacitor and the second capacitor during a discharge period; and
a first conductive plate separated from the sensor plate, the first conductive plate coupled with the voltage source via the second node,
wherein a voltage difference between the sensor plate and the first conductive plate is maintained at the predetermined voltage difference during the charge period and the discharge period of the control circuit,
wherein the voltage source includes a transistor and a current source, a gate of the transistor connected via the first node to the control circuit, and a terminal of the transistor connected via the second node to the current source,
wherein the current source is configured to provide a current of a predetermined magnitude, and the predetermined voltage difference is determined by the predetermined magnitude of the current.

14. A method of detecting a fingerprint, the method comprising:
providing a sensor plate for detecting a first capacitance in response to a touch event;
providing a first conductive plate separated from the sensor plate;
electrically connecting the sensor plate via a first node to a voltage source;
electrically connecting the first conductive plate via a second node to the voltage source, the voltage source configured to establish a predetermined voltage difference between the first node and the second node; and
determining the fingerprint by charging one of a first capacitor associated with the first capacitance and a second capacitor during a charge period and discharge the one of the first capacitor and the second capacitor during a discharge period,
wherein a voltage difference between the sensor plate and the first conductive plate is maintained at the predetermined voltage difference during the charge period and the discharge period,
wherein the voltage source includes a transistor and a current source, further comprising:
connecting a gate of the transistor connected via the first node to the sensor plate, and connecting a terminal of the transistor connected via the second node to the current source,
wherein the current source is configured to provide a current of a predetermined magnitude, further comprising:
providing the predetermined voltage difference based on the predetermined magnitude of the current.

* * * * *